United States Patent
Brigham, Jr. et al.

(10) Patent No.: US 7,211,739 B1
(45) Date of Patent: May 1, 2007

(54) ELECTROMAGNETIC INTERFERENCE (EMI) SHIELD FOR A CABLE-BULKHEAD INTERFACE

(75) Inventors: Joseph L. Brigham, Jr., North Attleborough, MA (US); Mickey S. Felton, Sterling, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 11/389,800

(22) Filed: Mar. 27, 2006

(51) Int. Cl.
*H01R 13/468* (2006.01)
(52) U.S. Cl. ............... 174/359; 439/609; 439/939
(58) Field of Classification Search ........... 439/609, 439/607, 939; 174/359
See application file for complete search history.

(56) References Cited

U.S. PATENT DOCUMENTS

| | | | |
|---|---|---|---|
| 6,717,047 | B2 | 4/2004 | Haselby et al. |
| 6,881,095 | B2 | 4/2005 | Murr et al. |
| 7,001,217 | B2 | 2/2006 | Bright et al. |
| 7,077,696 | B2 * | 7/2006 | Haga et al. ............ 439/553 |
| 2002/0142636 | A1 | 10/2002 | Murr et al. |
| 2002/0145856 | A1 | 10/2002 | Jones et al. |
| 2004/0203289 | A1 * | 10/2004 | Ice et al. .............. 439/607 |

* cited by examiner

*Primary Examiner*—Hung V. Ngo
(74) *Attorney, Agent, or Firm*—Guerin & Rodriguez, LLP; Michael A. Rodriguez (57) ABSTRACT

An electromagnetic interference and radio frequency interference (EMI/RFI) shield adapted to reduce unwanted EMI/RFI from a shielded cable assembly—equipment enclosure interface. The EMI/RFI shield includes one or more conductive walls extending substantially perpendicular from an outer surface of the shielded enclosure. The one or more walls are positioned adjacent to sides of a panel-mounted connector. Each of the walls includes an EMI/RFI gasket segment coupled thereto, each gasket segment positioned to engage compressibly a respective side of a shielded cable assembly when it is coupled to the panel-mounted connector. Each engaged side of the shielded cable assembly is in electrically conductive contact with the shielded equipment enclosure through the respective EMI/RFI gasket segment and adjoining wall. Additionally, the EMI/RFI shield provides mechanical support to the interconnected cable assembly further reducing EMI/RFI by improving alignment of the coupled connector.

20 Claims, 11 Drawing Sheets

FIG. 9

ELECTROMAGNETIC INTERFERENCE (EMI) SHIELD FOR A CABLE-BULKHEAD INTERFACE

FIELD OF THE INVENTION

The invention relates generally to an electromagnetic interference or radio frequency interference (EMI/RFI) shielding arrangement for enclosures housing electrical equipment. More particularly, the invention relates to EMI/RFI shielding for cabled interconnects to such enclosures.

BACKGROUND

Some electronic devices emit electromagnetic radiation. To prevent deleterious interference of electromagnetic radiation upon other electronic equipment, limits are placed on the permissible amount of electromagnetic emissions from enclosures housing electronic devices. To comply with these limits, enclosures are typically sealed and made of electrically conductive material. Invariably, one or more interconnections are provided for communicating with the electronic devices or boards housed therein. Shielded cable assemblies can be connected to the enclosure at one or more panels or bulkheads; however, these connections can be vulnerable to EMI/RFI leakage. To prevent such EMI/RFI leakage, a tight seal is needed between the shielded cable assembly and the enclosure.

One solution is to use a shielded connector adapted to secure the cable assembly tightly to the enclosure. One class of such connectors uses threaded housings or backshells that mate with a complementary threaded fitting provided at the enclosure (e.g., threaded connectors often used with radio frequency coaxial cable). The circumferential and mechanically stable contact between the cable shield and the chassis surface produces an effective EMI/RFI blocking seal.

Some disadvantages to this solution, however, include limiting the use of connectors to those types having circular geometries. Additionally, their threaded interfaces can be relatively cumbersome to mate and un-mate as they may require the use of tools, such as a torque wrench. Further, many of the widely used standard interfaces (e.g., Fibre Channel) rely on rectangular geometries adapted for quick connects and disconnects. Thus, there is a need for a panel interconnect that has effective EMI/RFI shielding characteristics, supports connectors of different geometries, and allows for the use of quick connect/disconnect connectors.

SUMMARY

In one aspect, the invention features an electromagnetic interference and radio frequency interference (EMI/RFI) shield. The shield includes an electrically conductive wall having an inner surface. The wall extends substantially perpendicular from an outer surface of an electrically conductive equipment panel. The wall is in electrically conductive contact with the outer surface of the equipment panel, adjacent to an edge of an aperture in the equipment panel. The EMI/RFI shield also includes an EMI/RFI gasket segment coupled to the inner surface of the wall. The gasket segment compressibly engages an electrically conductive side of a cable assembly when the cable assembly is plugged into the aperture. The wall and the gasket provide an electrically conductive path between the cable assembly and the equipment panel.

In another aspect, the invention features a method for shielding electromagnetic interference and radio frequency interference (EMI/RFI) at one end of a shielded cable assembly coupled to a connector interface at an exterior surface of an electrically conductive equipment panel. The method includes electrically coupling an elongated EMI/RFI gasket to an inner surface of an electrically conductive wall. The wall extends perpendicular from the outer surface of the equipment panel and is located proximate to the connector interface. The EMI/RFI gasket is positioned to compressibly engage an adjacent outer side of the shielded connector when the connector is coupled to the connector interface. The EMI/RFI gasket is compressed between the electrically conductive wall and the electrically shielded connector. The electrically conductive wall and the compressed gasket provides an electrically conductive path between the electrically shielded connector and the equipment panel.

In still another aspect, the invention features an electromagnetic interference and radio frequency interference (EMI/RFI) shield assembly comprising alignment means proximate to a connector interface of an electrically conductive equipment panel for aligning an interconnecting cable assembly to the connector interface, and compressible means for providing an electrically conductive path between the alignment means and an outer surface of a connector.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

A shielded enclosure constructed in accordance with the invention permits improved grounding of an interconnecting cable assembly to an exterior surface of the enclosure. In brief overview, an EMI/RFI shield assembly is coupled to an exterior surface of a shielded equipment enclosure proximate to an interconnecting receptacle. The shield assembly has one or more electrically conductive, rigid walls extending perpendicularly from the exterior surface of the enclosure. The walls are adjacent to the sides of the receptacle. Each wall includes an EMI/RFI gasket segment coupled to an inner surface of the wall. Each EMI/RFI gasket engages one side of a shielded connector coupled to the receptacle. The gasket-lined walls of the shield assembly thus electrically couple the shielded connector to the exterior surface of the shielded enclosure.

Figure 1:
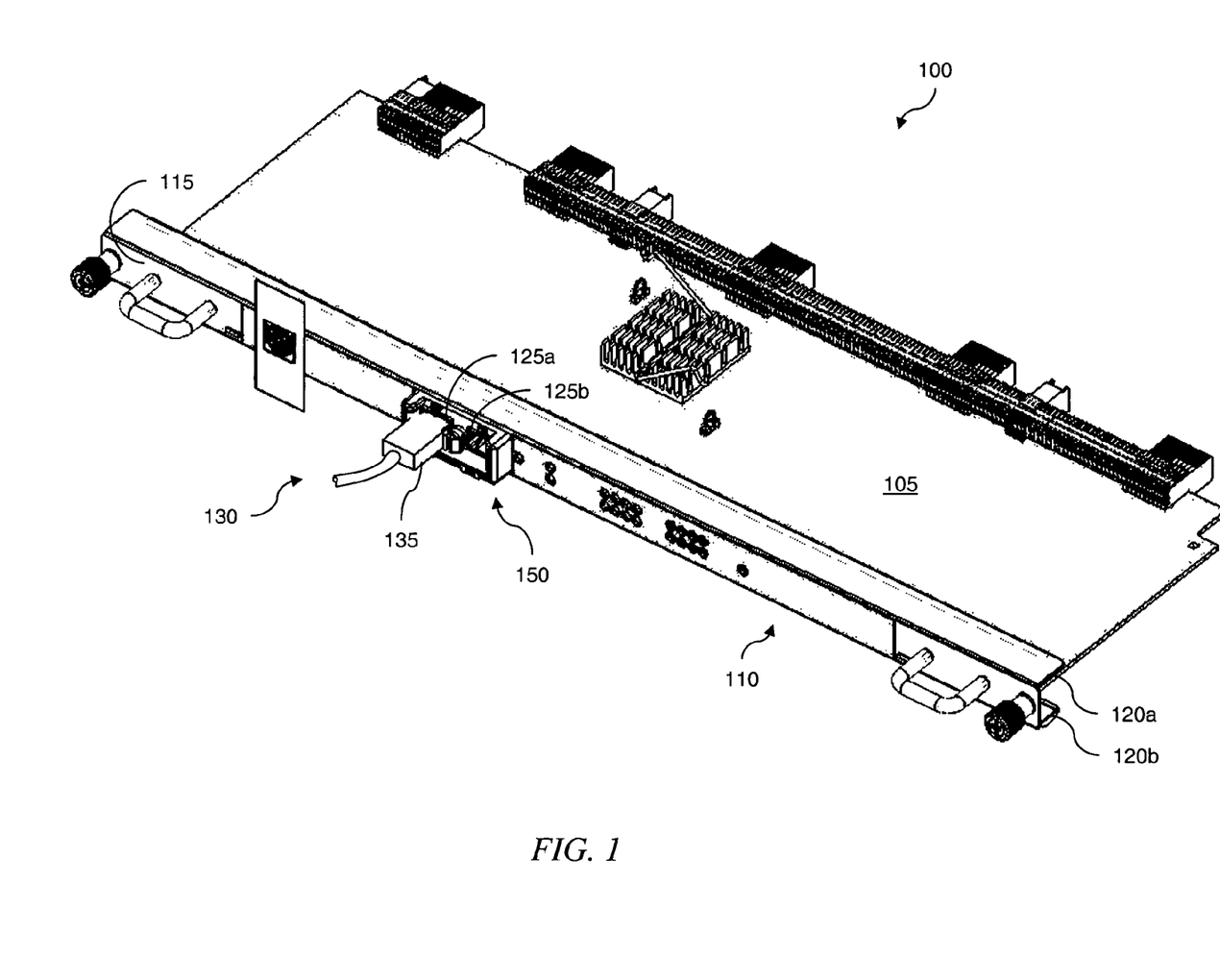
FIG. 1 is a top-perspective view of an embodiment of an EMI/RFI shield assembly constructed in accordance with the invention and coupled to a bulkhead of an electronic equipment assembly.

FIG. 1 shows an embodiment of an electronic equipment assembly 100 in which aspects of the present invention may be implemented. The electronic equipment assembly 100 includes circuitry that may reside in one or more electronic modules, on a printed circuit board 105, or in a combination of modules and printed circuit boards 105. These electronic circuits, when operating, may generate residual, unwanted electromagnetic noise that can produce EMI/RFI with other electronic devices. To reduce the likelihood that EMI/RFI may interfere with other electronic devices, some form of shielding is typically provided. For example, the assembly 100 can be adapted for insertion into a shielded equipment enclosure (e.g., a metal box or cage). To seal the opening of the enclosure through which the electronic equipment assembly 100 is inserted, the electronic equipment assembly 100 also includes an electrically conductive panel (here a front panel) or bulkhead 110 positioned along an edge of the circuit board 105.

The bulkhead 110 includes an external (i.e., front) surface 115 that generally remains exposed and accessible after the electronic equipment assembly 100 is inserted into the shielded equipment enclosure. To provide additional surface area for contacting other panels or shielding components of the enclosure, the bulkhead 110 includes top and bottom extensions, or flanges 120a, 120b. These flanges 120a, 120b may overlap complementary panel extensions or flanges provided on the equipment enclosure to form tortuous paths that reduce leakage of EMI/RFI across the shield boundary. Alternatively, or in addition, the flanges 120a, 120b can couple to the equipment enclosure through one or more EMI/RFI gaskets (not shown) aligned between the flanges 120a, 120b and other conducting surfaces of the equipment enclosure.

The bulkhead 110 is electrically conductive and can be formed from sheet metal by stamping, cutting, or a combination thereof, to produce a desired shape. In other embodiments, the bulkhead 110 is formed from a cast metal, from a conductively coated insulator, such as an injected molded plastic coated with a conductive layer, and from combinations thereof. The flanges 120a, 120b are also conducting and can be an integral part to the bulkhead 110. For example, the flanges 120a, 120b can be formed from extensions provided along the top and bottom edge of a sheet metal bulkhead 110 by bending these extensions inward from the front surface 115 by about 90°.

The bulkhead 110 also includes one or more apertures providing external access to the circuit board 105. In an exemplary embodiment, the bulkhead 110 includes two adjacent, rectangular apertures 125a, 125b representing primary (PRI) and expansion (EXP) ports of a Fibre Channel or INFINIBAND® interface (the exemplary embodiment is described in terms of a Fibre Channel interface, but the invention in its broadest sense can be applied to any shielded-cable interconnect, including those with fiber optic cables and power leads). A shielded cable assembly 130 includes a shielded connector (e.g., a plug) 135 that can be independently and removably connected to a mating connector (e.g., a receptacle) provided at each of the apertures 125a, 125b. Additional apertures may be provided for cooling vents, for access to controls (e.g., switches, buttons, and keypads), and for status indicators (e.g., audio indicators, such as speakers, and visual indicators, such as display screens and light-emitting diodes). The apertures 125a, 125b can be located anywhere along the bulkhead 110, e.g., at either or both ends, or near the center, as shown.

The shielded cable assembly 130 includes a cable shield or jacket terminating at one end to the shielded connector 135. In general, the cable may include one or more electrical leads, such as twisted pair or coaxial conductors, fiber optic cable, and any combinations thereof. The cable shield may include one or more conductive braids, conductive foils, conductive tape, and combinations thereof. The shielded connector 135 can include a generally rectangular connector, such as a D-series connector, a Serial Advanced Technology Attachment or SATA connector, a Small Computer System Interface (SCSI) connector, a modular connector (e.g., any of the Registered Jack or RJ-series connectors), and a Small Form Factor (SFF) connector. More generally, any type of a shielded connector can be used. In some embodiments, the shielded connector 135 includes a circular connector. In the exemplary embodiment, the shielded connector 135 is a High-Speed Serial Data Connector (HSSDC2), such as the HSSDC2 Fibre Channel plug, part number 1761073-1 available from TYCO Electronics of Harrisburg, Pa.

An EMI/RFI shield assembly 150 constructed in accordance with the principles of the invention is coupled to the exterior surface 115 of the bulkhead 110, where the EMI/RFI shield assembly 150 frames the apertures 125a, 125b of the Fibre Channel interface. The EMI/RFI shield assembly 150 is positioned such that a shielded connector 135 coupled to the electronic equipment assembly 100 through one of the apertures 125a, 125b, engages one or more of the sides of the EMI/RFI shield assembly 150. Through the EMI/RFI shield assembly 150, the shielded connector 135 is coupled to the exterior surface 115 of the bulkhead 110. This provides a low impedance path to chassis ground within the desired EMI/RFI frequency band. The through the EMI/RFI shield assembly 150 is described more fully below.

Figure 2:
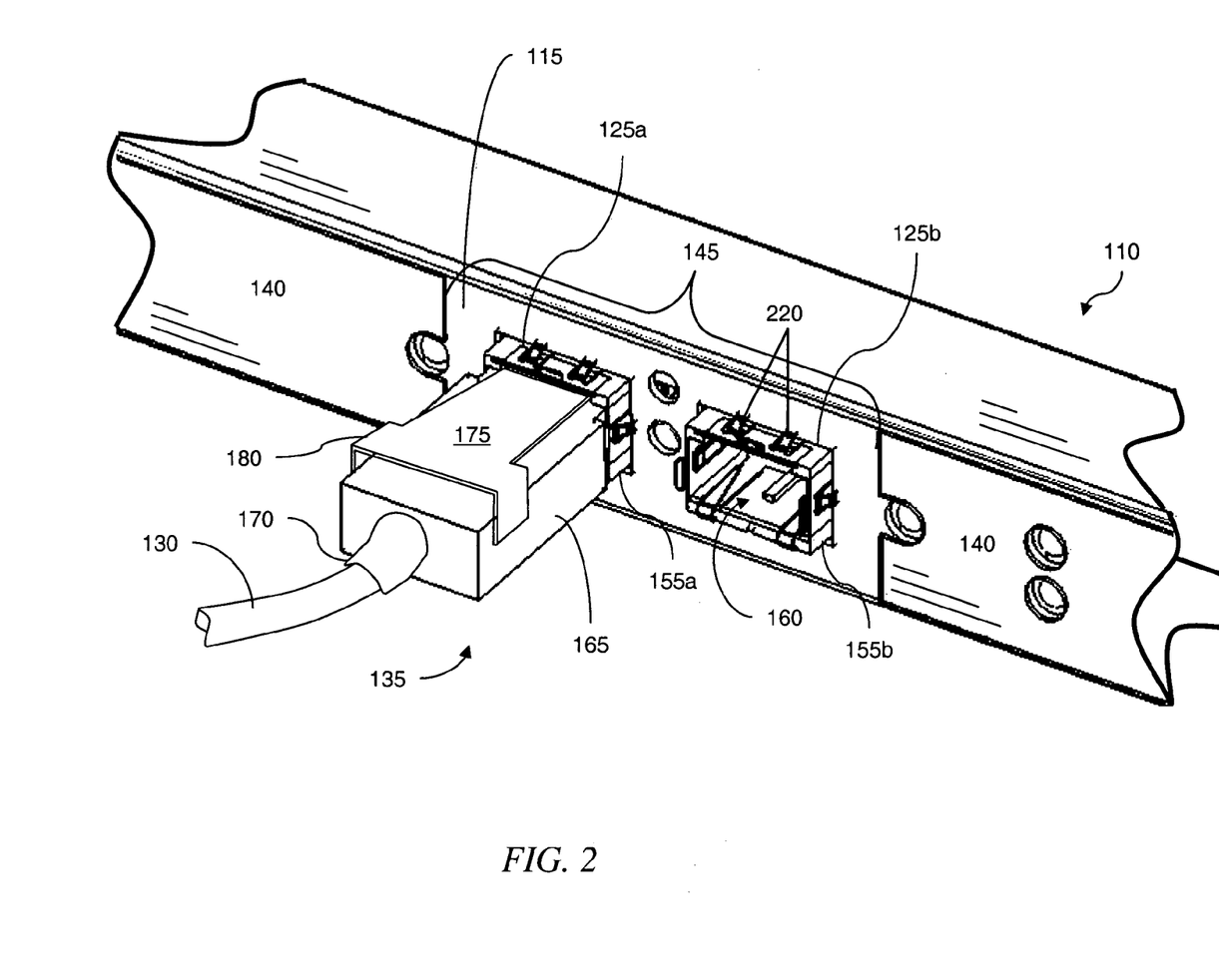
FIG. 2 is a perspective view of one end of a shielded cable assembly coupled to an EMI/RFI shielded receptacle at the bulkhead of the electronic equipment assembly.

FIG. 2 shows a portion of the bulkhead 110 without the shield assembly 150 attached thereto. In this embodiment, a label 140 extends across the front surface 115 of the bulkhead 110. The label 140 has been removed from a section 145 of the bulkhead 110 to expose the bulkhead's metal surface. The shield assembly 150 joins to this exposed section 145 of the bulkhead 100, to achieve an electrically conductive connection therebetween. Within this section 145, disposed within the apertures 125a, 125b, are HSSDC2 receptacles 155a, 155b, respectively. Each of the HSSDC2 receptacles 155a, 155b is typically mounted to the circuit board 105 and includes an open end 160 aligned with the respective aperture 125a, 125b and adapted to receive the shielded connector 135.

The HSSDC2 shielded connector 135 includes an electrically conductive (e.g., die cast) shell 165 terminated at one end by the shielded cable 130. In some embodiments, the shell 165 is a conductive backshell that surrounds a non-shielded connector. The shielded connector 135 includes a ferrule 170 used to reliably interconnect a shield or conductive jacket of the shielded cable 130 to the shell 165, thereby forming an EMI/RFI shield around the cables contained therein. The leading end of the shielded connector 135, opposite the ferrule 170 (not shown because the shielded connector 135 extends partially into the mating receptacle 155a), generally includes an opening to provide access for interconnecting to the one or more cables provided therein. For the exemplary HSSDC2 shielded connector 135, the shell 165 contains within its open end a printed-circuit-board extension having contact pads positioned to interconnect with corresponding electrical contact fingers (not shown) of the HSSDC2 receptacle 155a. Optionally, each of the shielded connector 135 and its mating receptacle 155a, 155b includes a key to prohibit inadvertent mating of incompatible connectors (e.g., the shielded connector 135 is equipped with a Fibre Channel key to prevent inadvertent mating with an INFINIBAND® receptacle).

In some embodiments, the shielded connector 135 includes a spring clip 175 to facilitate mating and un-mating of the shielded connector 135 and receptacle 155a. For example, the spring clip 175 includes a cantilever spring pivotally attached at one end to the shell 165. The spring clip 175 is electrically conductive and biased with its unattached end protruding from the shell 165. When the shielded connector 135 is inserted into the receptacle 155a, the spring clip 175 is partially compressed, pressing against a corresponding interior side of the receptacle 155a.

An end portion 180 of the spring clip 175 remains exposed when mated, protruding from the receptacle 155a and providing a surface that can be manipulated by an operator to remove the shielded connector 135 from the receptacle 155a without tools. Namely, the shielded connector 135 can be removed from the receptacle 155a by depressing the spring clip end portion 180 and pulling the shielded connector 135 straight out, away from the bulkhead 110.

Figure 3:
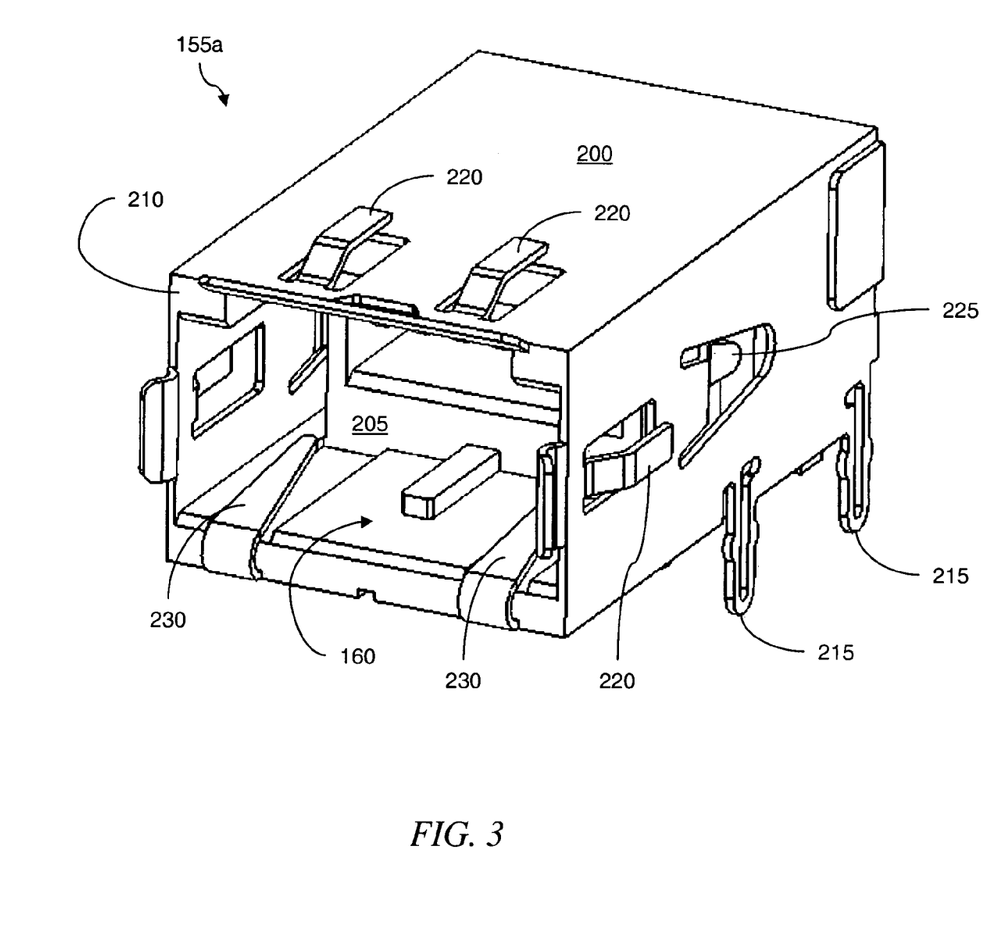
FIG. 3 is a more detailed perspective view of an EMI/RFI cage of the shielded receptacle of FIG. 2.

In more detail, referring to FIG. 3, the shielded HSSDC2 receptacle 155a includes an electrically conductive cage 200. The cage 200 surrounds the top, bottom and sides of an insulated housing 205 mounted therein. The insulated housing 205 includes electrical contact fingers (not shown). The cage 200 includes the opening 160 (FIG. 2) accessible at a front face 210 and adapted to receive the shielded connector 135 (FIG. 2). The cage 200 also includes a number of circuit board or chassis mounting members 215 adapted for insertion into mounting apertures in the circuit board 105 (FIG. 1) or chassis. The mounting members 215 securely couple the receptacle 155a to the circuit board 105 or chassis and can also be use to couple the cage 200 to an electrical ground plane of the circuit board 105 or directly to chassis ground.

The cage 200 also includes a number of grounding contacts 220 protruding outward to engage the bulkhead 110 when the front face 210 is inserted through the aperture 125a (FIG. 2 shows the grounding contacts 220 engaging the bulkhead 110). Side and bottom inward contact members 225, 230 protrude inward within the open end 160 to engage the sides and bottom of the shell 165 when inserted therein. Electrical contact along the top of the cage 200 occurs through engagement of the spring clip 175 (FIG. 2).

At high frequencies (e.g., above 2 GHz) the cage 200 may provide inadequate EMI/RFI shielding due, in part, to the quality of the electrical contact of the cage 200 to the bulkhead 110. This electrical contact occurs through narrow and spaced-apart grounding contacts 220, leaving several sizeable gaps around the perimeter of each cage 200. Additionally, the electrical path from the shield of the interconnecting cable to chassis ground of the electronic equipment assembly 100 occurs principally through two junctions. A first junction is the interconnection of the shell 165 (FIG. 2) to the receptacle cage 200 through the contact of the inward contact members 225, 230 with the shell 165. A second junction is the interconnection of the receptacle cage 200 to chassis ground through the circuit board or chassis mounting members 215. Because each path includes a relatively narrow and elongated path near the electrical contact points, there will be an associated inductance tending to increase transfer impedance at high frequencies. Further, the cage 200 does not adequately restrict the placement or lateral movement of the connector 135 within the receptacle 155a. A slight displacement of the connector 135 within the receptacle 155a can provide an additional avenue for EMI/RFI leakage.

Figure 4:
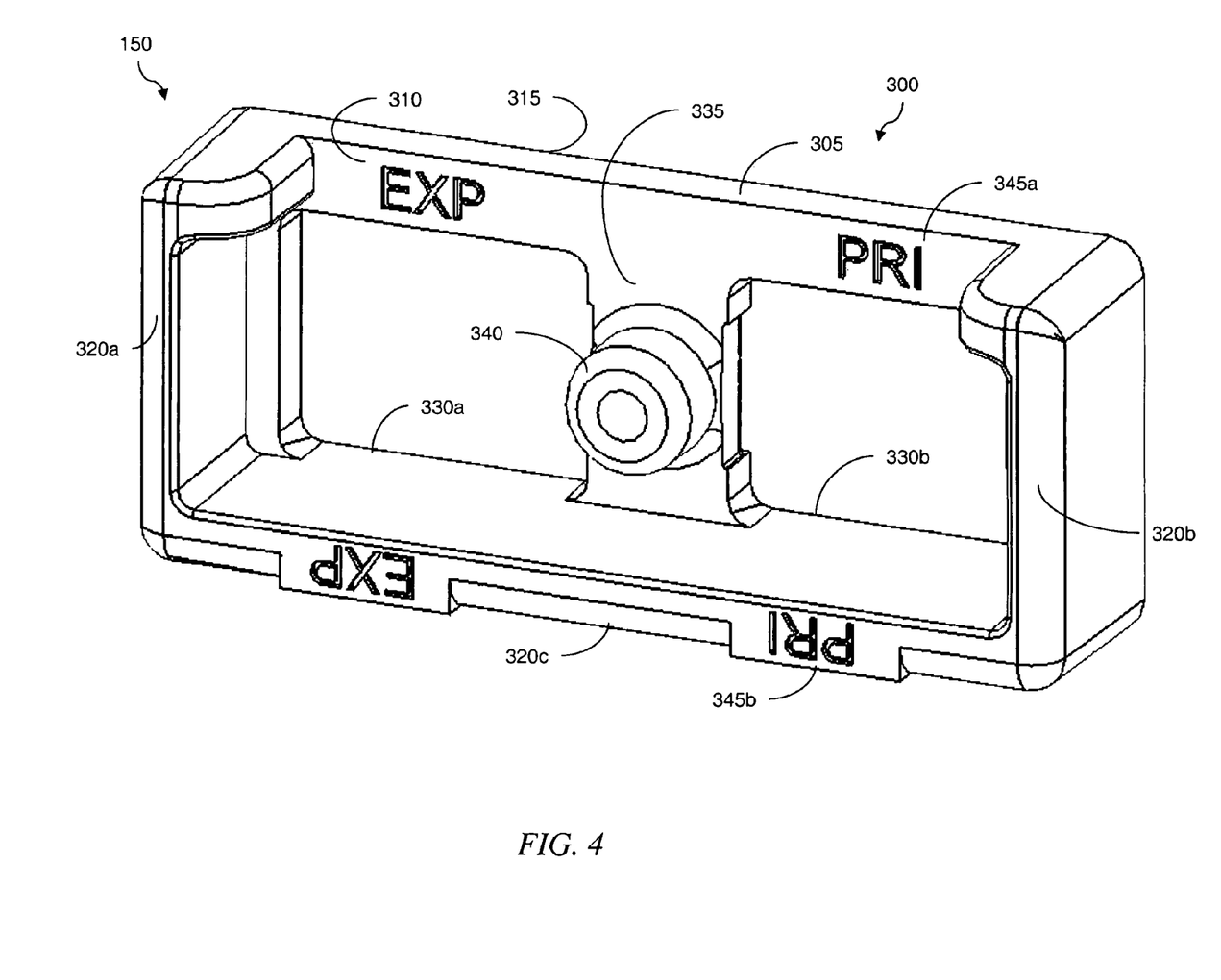
FIG. 4 is a front-perspective view of a frame portion of the EMI/RFI shield assembly of FIG. 1.

FIG. 4 shows a front-perspective view of an embodiment of a frame 300 of the EMI/RFI shield assembly 150 (FIG. 1) adapted for shielding a plurality of rectangular connectors. The frame 300 can be formed from a machined block of metal, from a metal casting, from sheet metal suitably stamped and bent to form the one or more walls, or from a conductive-coated polymer (e.g., an injection-molded plastic assembly with a conductive coating applied thereto). In one embodiment, the frame 300 is formed as die cast zinc.

The frame 300 includes a planar base member 305 adapted for attachment to a surface of an electrically conductive equipment panel (e.g., the bulkhead surface 115). The base member 305 includes a front surface 310 defining two rectangular apertures 330a, 330b, an opposing rear surface 315 that abuts the bulkhead surface 115 when installed thereon, and a center segment 335 extending between the two apertures 330a, 330b. Each aperture 330a, 330b allows access to a respective one of the receptacles 155a, 155b (FIG. 1). The center segment 335 includes anchor protrusion 340 extending from the front surface 310. The anchor protrusion 340 defines a threaded bore (not shown) opening to the rear surface 315. The rear surface 315 also includes a boss (not shown) to facilitate attachment of the frame 300 to the bulkhead 110.

The frame 300 also includes three walls: a left wall 320a, a right wall 320b, and a bottom wall 320c (generally, wall 320). Each wall 320 extends generally perpendicular from the front side 310 of the base member 305. The left and right walls 320a, 320b are each aligned with an adjacent side edge of a respective one of the rectangular apertures 330a, 330b (e.g., the left wall 320a being adjacent to the left edge of the left aperture 330a, and the right wall 320b being adjacent to the right edge of the right aperture 330b). The bottom wall 320c is disposed along a bottom edge of each rectangular aperture 330a, 330b. The walls 320 can be integrally formed together with the base member 305, being formed from the same material. In some embodiments, the base member 305 and bottom wall 320c each include one or more respective markings 345a, 345b identifying and differentiating the different ports associated with each of the apertures 330a, 330b.

Figure 5:
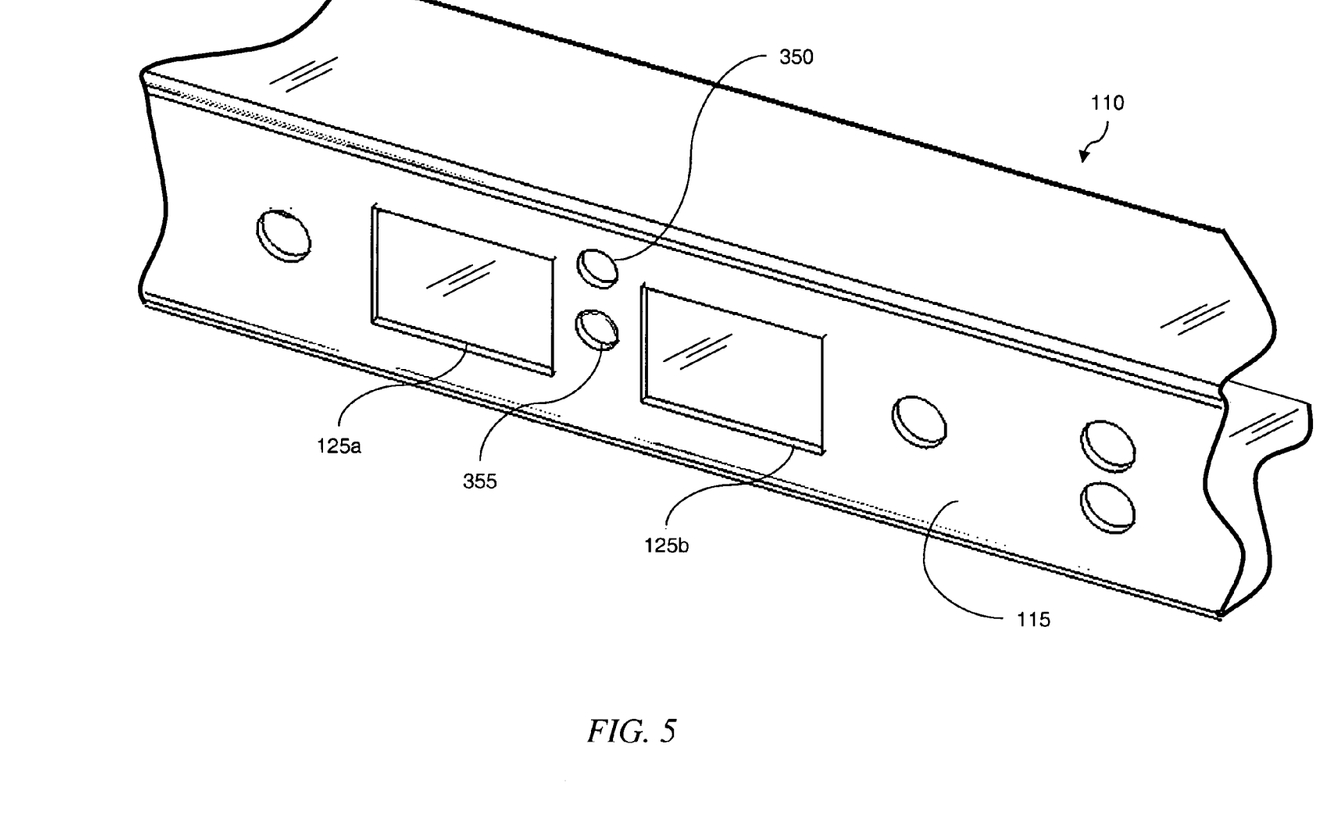
FIG. 5 is a front-perspective view of a portion of the bulkhead of FIG. 1.

FIG. 5 shows a portion of the bulkhead 110 showing the front surface 115 in more detail near the two apertures 125a, 125b. A top circular aperture 350 and a bottom circular aperture 355 reside in a region of the bulkhead 110 between the two bulkhead apertures 125a, 125b. The top circular aperture 350 provides an alignment hole for receiving the boss protruding from the rear surface 315 of the frame 300, facilitating attachment of the frame 300 to the bulkhead 110. The bottom circular aperture 355 provides a hole through which a mounting screw can be inserted from the inside of the bulkhead 110. The mounting screw is inserted through the bulkhead 110 and into the threaded bore of the anchor protrusion 340. When sufficiently tightened, the fastening screw secures the frame 300 to the bulkhead 110. The walls 320 extend substantially perpendicular from the bulkhead 110 when the frame 300 is coupled thereto.

Figure 6:
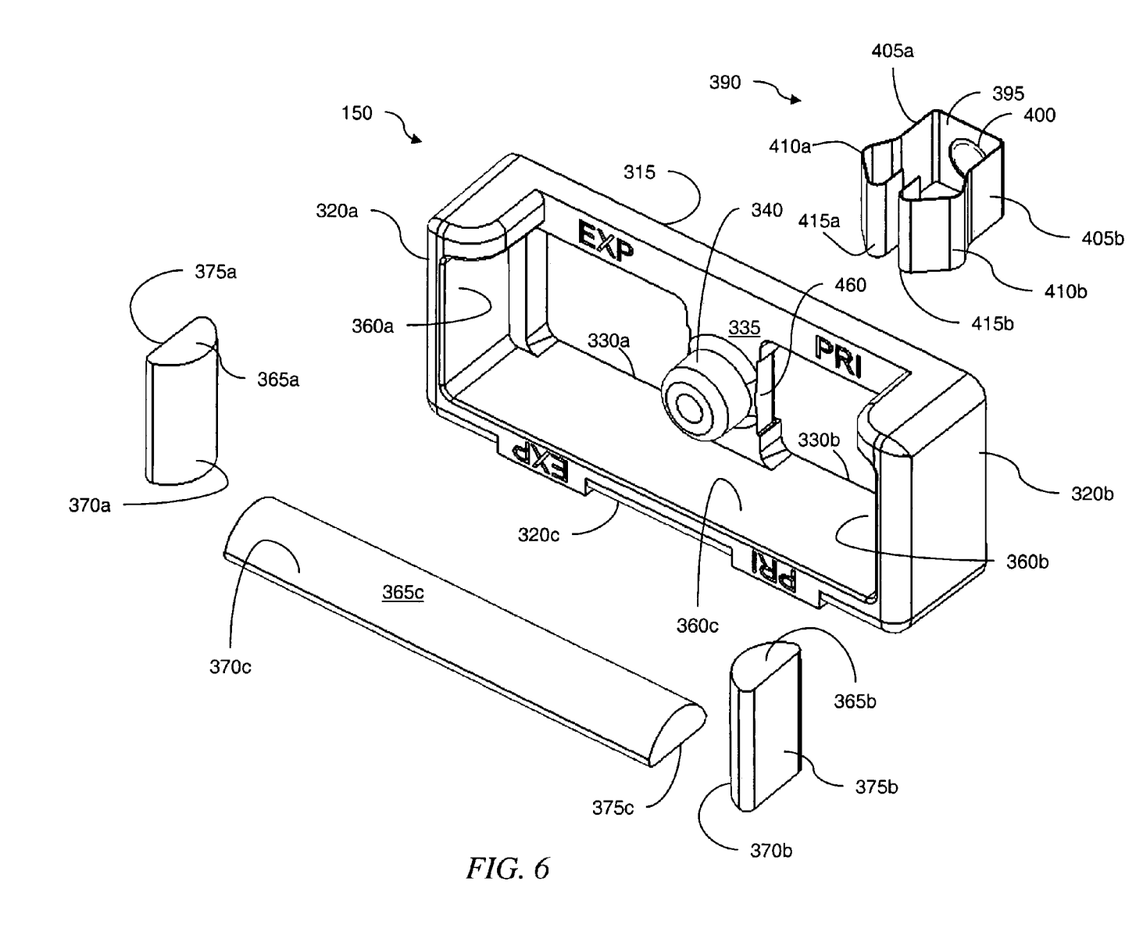
FIG. 6 is an exploded view of the EMI/RFI shield assembly of FIG. 1.

FIG. 6 shows an exploded view of an exemplary embodiment of the EMI/RFI shield assembly 150. Each wall 320a, 320b, 320c includes a respective inner surface 360a, 360b, 360c (generally 360) facing the apertures 330a, 330b (generally 330). To ensure effective engagement of each wall 320 with a shielded connector 135 that is inserted into one of the apertures 330, a respective EMI/RFI gasket 365a, 365b, 365c (generally 365) is attached to each inner surface 360. In general, each gasket 365 has an elongated shape, sized to cover much of the length and width of the inner surface 360 of its respective wall 320.

An attachment side 375a, 375b, 375c (generally 375) of each gasket 365a, 365b, 365c, respectively, is securely fastened to the inner surface 360 of each respective wall 320. Depending upon the gasket material selected, each gasket 365 can be attached using mechanical fasteners (e.g., screws or clips), chemical fasteners (e.g., conductive tapes or adhesives), thermal bonding, soldering, welding and any combination thereof. Whichever method of attachment is used, electrical contact is maintained between each gasket 365 and its respective wall 320.

The gaskets 365 are generally resilient, and positioned such that in a non-compressed state, the gasket 365 extends inward to engage an adjacent side of a shielded connector 135 when the connector 135 mates with a receptacle 155. When the shielded connector 135 mates with one of the shielded receptacles 155, the shell 165 compresses one or more gaskets 365. For instance, a shielded connector 135 inserted into the left aperture 330a would abut and compress the left wall gasket 365a and a left portion of the bottom gasket 365c, whereas a shielded connector 135 inserted into the right aperture 330b would abut and compress the right wall gasket 365b and a right portion of the bottom gasket 365c. The resilient gaskets 365 are allowed to expand back to their respective uncompressed shapes after the shielded connector 135 is removed from the receptacle 155 and withdrawn from the EMI/RFI shield assembly 150. The gaskets 365 can be formed from springs, fingerstock, wire mesh, conductive fabric, conductive fabric over foam, conductive elastomers, conductive-coated elastomers, conductive foil wrapped foam, low ESR/ESL (equivalent series resistance/equivalent series inductance) material, and combinations thereof.

At least two parameters determine the amount of compression of a gasket: (i) the thickness of the gasket, measured perpendicular to the inner surface 360 of the respective wall, and (ii) the distance between the inner surface 360 and the edge of the aperture 330. Additionally, each elongated gasket 365 has a tapered, smooth profile along its leading and trailing edges. Such a tapered profile reduces the possibility of damage either to the shielded connector 135 or to the gasket 365 during insertion and removal of the shielded connector 135.

The EMI/RFI shield assembly 150 also includes an electrically conductive spring clip 390 with a mounting surface 395 for making electrical contact with the rear surface 315 of the frame 300. The spring clip 390 also includes two cantilevered spring walls 405a, 405b (generally 405). The spring walls 405 generally extend outward, perpendicularly from the plane of the mounting surface 395. Each of the spring walls 405a, 405b can include a respective protruding segment 410a, 410b for engaging a shielded connector 135 when the connector 135 plugs into a receptacle 155. Alternatively, or in addition, the leading edges 415a, 415b of each spring wall 405a, 405b, respectively, can include a rounded surface or "bull nose" to facilitate slideable engagement with a shielded connector 135 and reduce the possibility of damage during insertion and removal of the shielded connector 135.

The spring clip 390 can be formed from an elongated sheet of electrically conductive material, such as a beryllium-copper alloy. Opposing ends of the elongated sheet of material are each bent inward by about 90° to form the spring walls 405a, 405b. A portion of the center of the sheet material remains unbent to form the mounting surface 395. Additional bends can be provided in each of the walls 405a, 405b to form the protruding segments 410a, 410b and leading edges 415a, 415b.

To mount the spring clip 390 to the frame 300, each spring wall 405a, 405b enters one of the apertures 330a, 330b from the rear surface 315 of the frame 300 until the mounting surface 395 abuts the rear surface 315 behind the center segment 335. The frame 300 may include notches 460 along the sides of the center segment 335 to retain the spring clip 390 in position. The mounting surface 395 can include an aperture 400 used to assist aligning and attaching the spring clip 390 to the frame 300. For example, the screw used to mount the frame 300 to the bulkhead 110 can traverse the aperture 400, thereby securing the mounting surface 395 between the frame 300 and the bulkhead 110.

When installed together with the frame 300, the spring clip 390 is positioned such that the protruding segments 410a, 410b extend inward in a non-compressed state to engage an adjacent side of a shielded connector 135 when the shielded connector 135 is plugged into a receptacle 155. When a shielded connector 135 is plugged into a shielded receptacle 155, the shell 165 of the connector 135 urges against the adjacent cantilevered spring wall 405. Thus, a shielded connector 135 plugged into the left aperture 330a would urge against the left protruding segment 410a, thereby bending the left spring wall 405a toward the center segment 335.

Figure 7A:
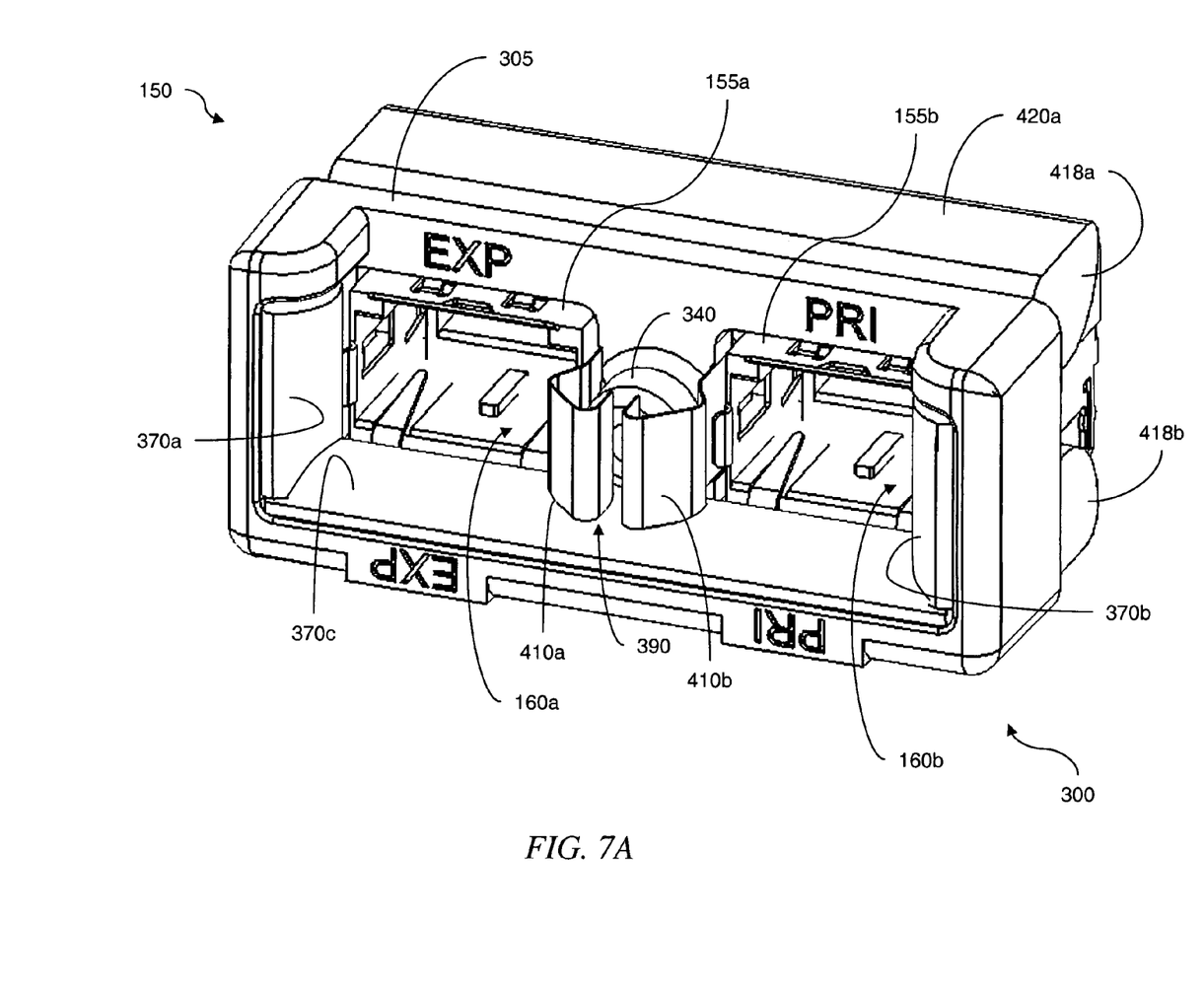
FIG. 7A is a front-perspective view of the EMI/RFI shield assembly of FIG. 1 aligned with two shielded receptacles disposed at the bulkhead.

FIG. 7A shows a front-perspective view of the assembled EMI/RFI shield assembly 150 framing the two receptacles 155a, 155b. Each side gasket surface 370a, 370ba is aligned with a respective outer edge of the adjacent receptacle 155a, 155b, and the bottom gasket surface 370c is aligned with the bottom edges of both receptacles 155a, 155b. The inner edges of each receptacle 155a, 155b are aligned to abut an adjacent protruding segment 410a, 410b of the spring clip 390.

In the exemplary embodiment, the two cantilever wall sections 405a, 405b of the spring clip 390 surround the anchor protrusion 340. This permits closer spacing of the two apertures 330a, 330b than would have been possible had the same gaskets been used on either side of the anchor protrusion. Relocating the anchor protrusion 340 to another region, such as along the outer edges of the frame 300, may provide sufficient space to include a middle wall with gaskets along either side. The exemplary embodiment may be preferable for applications in which panel space is limited.

Figure 7B:
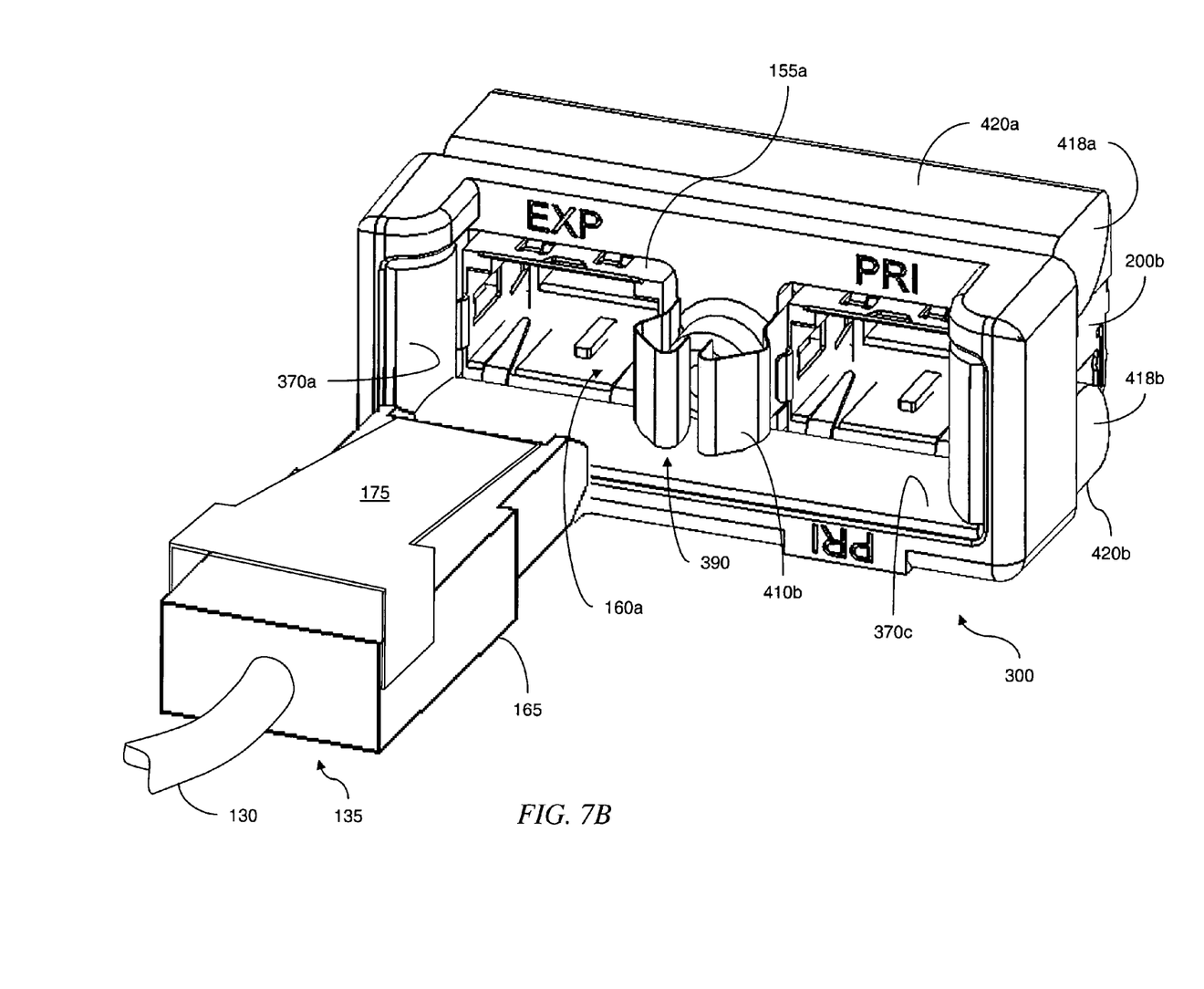
FIG. 7B is a front-perspective view of one end of the shielded cable assembly aligned for insertion into one of the shielded receptacles.

FIG. 7B shows a front-perspective view of the assembled EMI/RFI shield assembly 150 framing the two receptacles 155a, 155b with the shielded connector 135 positioned to enter the receptacle 155a. The spring clip 175 pivotally attached to the shell 165, gaskets 365, and spring clip 390 are in their uncompressed, pre-insertion states. In FIG. 7B, the bulkhead 110 is not shown to reveal additional shielding that can be applied to interior surfaces of the bulkhead 110. For example, top and bottom EMI/RFI gaskets 418a, 418b can be positioned along an interior surface of the bulkhead 110, above and below the rectangular receptacles 155a, 155b. These interior gaskets 418a, 418b include respective mounting surfaces 420a, 420b that are attached to interior surfaces of the bulkhead flanges 120a, 120b. The interior gaskets 418a, 418b can include any of the EMI/RFI gaskets described herein and be attached to its respective flange 120a, 120b according to any of the attachment methods described herein. When installed in this manner, the interior gaskets 418a, 418b provide additional shielding to prevent EMI/RFI leakage through any gap between the bulkhead apertures 125a, 125b and the cages 200 (FIG. 3) of the receptacles 155a, 155b, and improve grounding from the connector 135 to chassis ground.

Figure 7C:
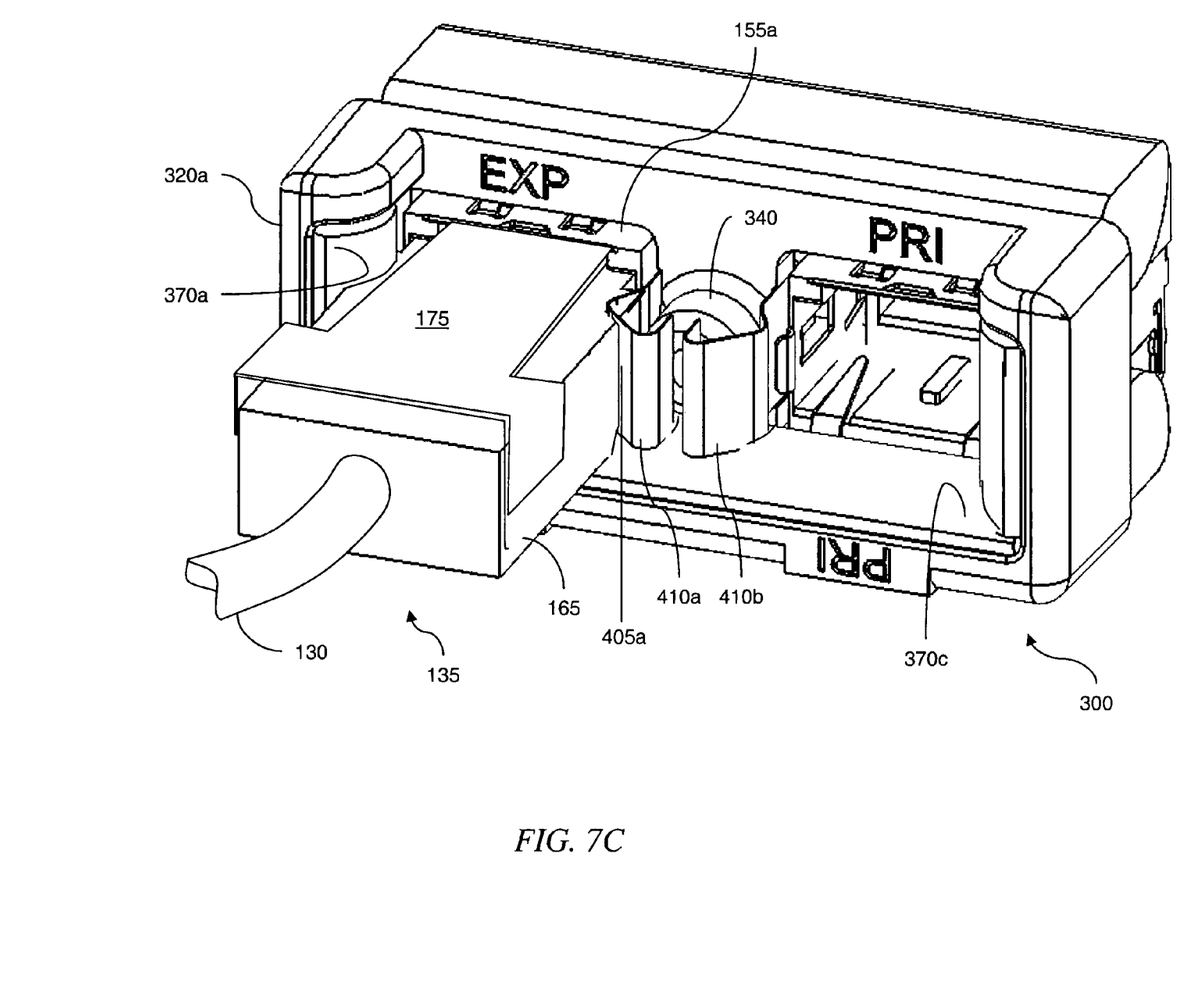
FIG. 7C is a front-perspective view of one end of the shielded cable assembly coupled to one of the shielded receptacles with the EMI/RFI shield assembly.

FIG. 7C shows a front-perspective view of one end of the shielded cable assembly 130 with its shielded connector 135 inserted into the left receptacle 155a. The spring clip 175 compresses against and makes electrically conductive contact with the top interior surface of the receptacle 155a. The left side of the shell 165 engages the inner surface 370a of the left wall gasket 365a, causing the gasket 365a to urge against the gasket wall 320a. Similarly, the bottom side of the shell 165 engages the inner surface 170c of the bottom gasket 365c, compressing the bottom gasket 365c against the bottom wall 320c. Additionally, the right side of the shell 165 engages the left wall 405a of the spring clip 390, urging the cantilever spring wall 405a toward the center of the frame 300. The electrically conductive contact between the shielded connector 135 and the gaskets 365a, 365c, between the gaskets 365a, 365c and the frame 300, and between the back surface of the frame 300 and the bulkhead 110, in effect, establishes electrically conductive contact around every side of the rectangular HSSDC2 connector 135. Thus, the EMI/RFI shield assembly 150 function as an extension of the bulkhead 110 (and, more generally, of the shielded enclosure). As a result, the shield of the cable assembly 130 is electrically terminated to chassis ground in a shorter path (i.e., less inductance), thus improving the EMI/RFI performance of the shielded enclosure, particularly at the high-frequency operation of the Fibre Channel interface.

Additionally, the EMI/RFI shield assembly 150 improves EMI/RFI shielding by providing structural support to the interconnected cable assembly 130. The structural support improves alignment and restricts movement of the plugged-in shielded connector 135, thereby reducing unwanted gaps between the connector 135 and the mated receptacle 155. The walls 320 of the frame 300 with their compressible gaskets 360 provide structural support and apply inwardly directed forces upon the mated shielded connector 135. In addition, opposing inward forces provided by the walls and the spring clip 390 tend to maintain the shielded connector 135 centrally aligned within the mated receptacle 155.

Figure 8:
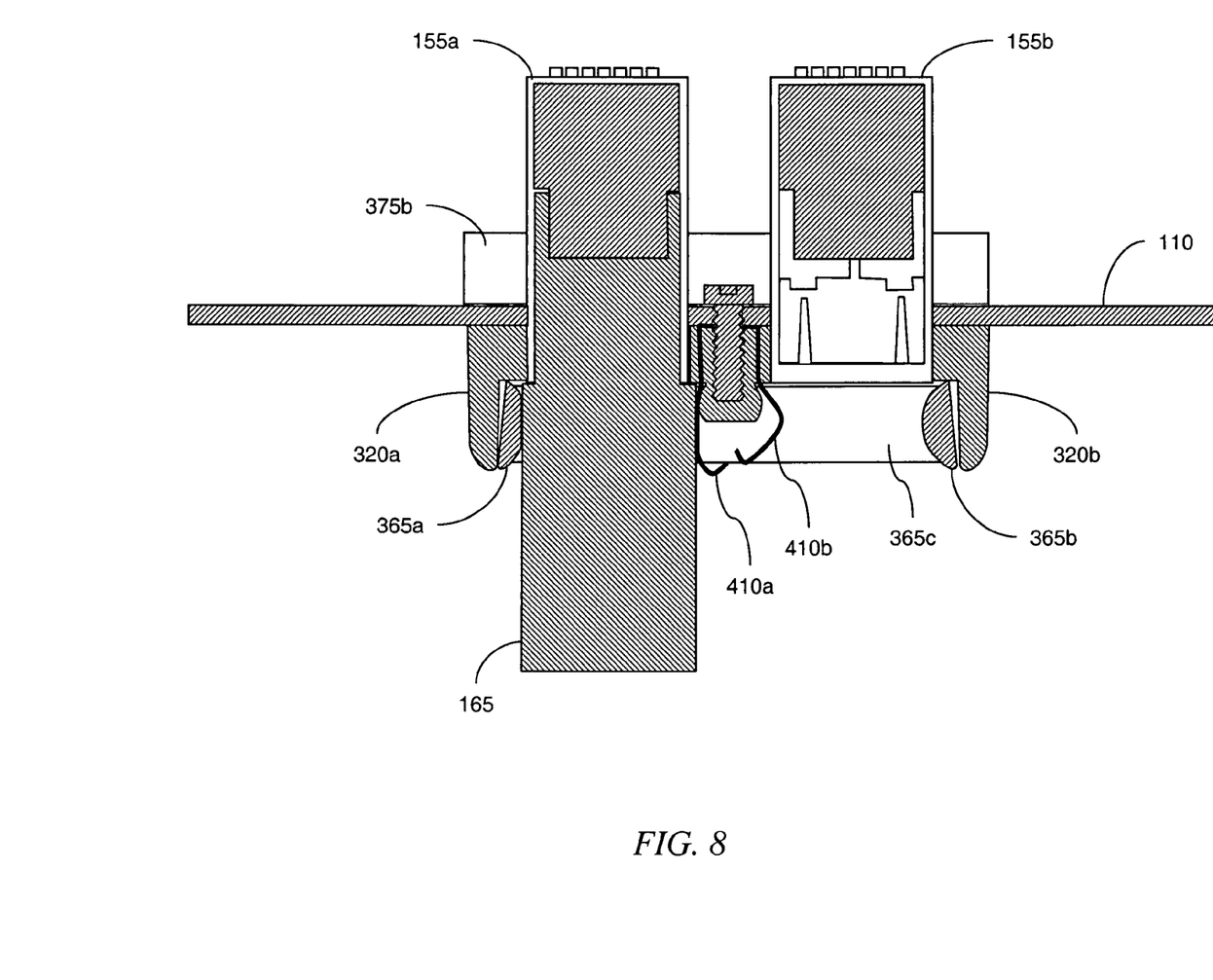
FIG. 8 is a top, cross-sectional view of one end of the shielded cable assembly coupled to one of the shielded receptacles of FIG. 7C.

FIG. 8 is a top, cross-sectional view of one end of the mated connectors of FIG. 7C. The shell 165 is coupled to the left receptacle 155a. The left gasket 365a is in a compressed state between the left wall 320a and the left side of the shell 165. The left cantilever wall 405a of the spring clip 390 is compressed, the wall 405a being urged toward the center by the right side of the shell 165. The right receptacle 155b is without a mating shielded connector 135. Consequently, the right gasket 365b, right cantilever wall 405b of the spring clip 390, and right-hand portion of the bottom gasket 365c are uncompressed.

Figure 9:
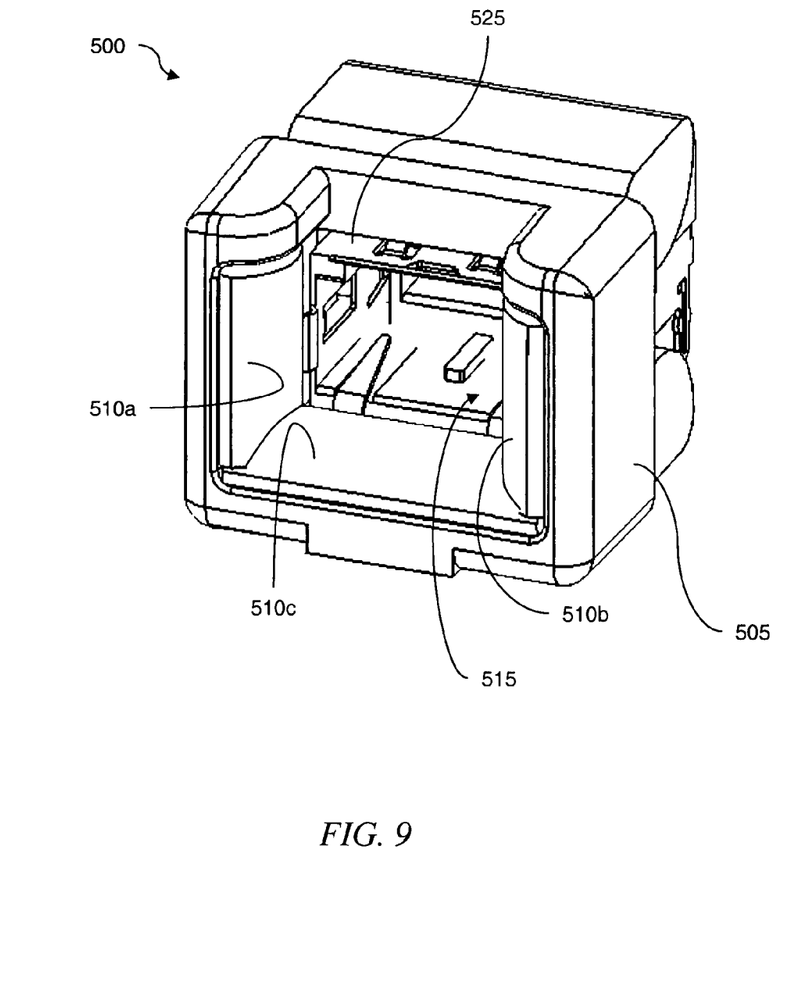
FIG. 9 is a front, perspective view of an alternative embodiment of an EMI/RFI shield assembly.

FIG. 9 is a front, perspective view of an alternative embodiment of an EMI/RFI shield assembly 500 for a single rectangular receptacle 525. The shield assembly 500 includes a frame 505 having left, right and bottom walls. Attached to inner surfaces of each wall of the frame 505 is a respective EMI/RFI gasket segment 510a, 510b, 510c (generally 510). The compressible gasket segments 510 are sized and positioned to engage the conductive shell 165 of the connector 135 when the connector 135 enters the opening 515 and is plugged into the receptacle 525. This embodiment does not include a spring clip 390 (FIGS. 7A–7C). Instead of engaging a spring clip 390, the shell 165 engages gasket-lined walls on three sides.

Additionally, this embodiment does not include an anchor protrusion, although an anchor protrusion may be included along an outer edge of the frame 505 so as not to interfere with the opening 515 to the receptacle 525. Attachment means other than an anchor protrusion, such as rivets, conductive adhesives, solder, welding, may server to attach the frame 505 to the bulkhead 110.

In yet other embodiments, different combinations of the gasket-lined walls can be used to make contact with the shielded connector 135. For example, one embodiment can have top and bottom gasket-lined walls, another embodiment can have top, left, and right gasket-lined walls, still another embodiment can have four gasket-lined walls (i.e., top, bottom, and both sides). Embodiments with three or fewer walls enable an operator to insert and remove the connector manually from a mated receptacle, provided the attachment/detachment feature of the connector coincides with the side without a wall. Any embodiment with four walls can present some difficulty for quick-disconnect type connectors that include an attachment clip, such as the HSSDC2 shielded connector 135, because one of the walls would tend to obstruct manual access by an operator. The fourth wall could also inhibit proper operation of the clip by forcing it in an over-compressed state.

While the invention has been shown and described with reference to specific preferred embodiments, it should be understood by those skilled in the art that various changes in form and detail may be made therein without departing from the spirit and scope of the invention as defined by the following claims.

What is claimed is:

1. An electromagnetic interference and radio frequency interference (EMI/RFI) shield assembly for use with electronic equipment that includes a panel with an electrically conductive exterior surface having adjacent apertures formed therein and electrically conductive receptacles that penetrate the apertures, the EMI/RFI shield assembly comprising:

a base having an EMI/RFI gasket extending along a length thereof;

spaced apart, opposing side walls, each side wall extending substantially perpendicularly from the base and having an EMI/RFI gasket extending along a length thereof;

a back wall joined between the opposing side walls and extending substantially perpendicularly from the base, the back wall having an exterior surface, an interior surface, and first and second adjacent openings formed therein, each opening sized to closely receive an electrically conductive receptacle of the electronic equipment;

means for coupling the shield assembly to the panel such that the exterior surface of the back wall makes electrically conductive contact with the electrically conductive exterior surface of the panel, each opening in the back wall aligns with one of the apertures in the panel, and each electrically conductive receptacle penetrates one of the openings of the back wall and makes electrically conductive contact with the back wall; and an electrically conductive spring member coupled to the back wall and projecting inwardly between the first and second openings, wherein when a cable assembly is inserted into one of the receptacles, an electrically conductive shell of the cable assembly makes electrically conductive contact with the EMI/RFI gasket extending along the base, with the EMI/RFI gasket extending along one of the side walls, and with the spring member.

2. The shield assembly of claim 1, wherein the spring member includes a mounting surface that is disposed between and makes electrically conductive contact with the exterior surface of the back wall and the panel of the electronic equipment.

3. The shield assembly of claim 1, wherein the spring member includes opposing spring walls, each spring wall making electrically conductive contact with a surface of one of the electrically conductive receptacles when the shield assembly is coupled to the panel.

4. The EMI/RFI shield assembly of claim 1, wherein the means for coupling includes a mechanical fastener for attaching the back wall to the panel.

5. The EMI/RFI shield assembly of claim 1, wherein each EMI/RFI gasket is selected from the group consisting of:
springs; fingerstock; wire mesh; conductive fabric; conductive fabric over foam; conductive elastomers; conductive-coated elastomers; conductive foil wrapped foam; and combinations thereof.

6. The shield assembly of claim 1, wherein the spring member is dual-pronged, and wherein, when a cable assembly is inserted into each of the receptacles, each prong of the spring member makes electrically conductive contact with an electrically conductive shell of one of the cable assemblies.

7. The shield assembly of claim 1, wherein the means for coupling fastens a mounting surface of the spring member to the exterior surface of the back wall.

8. The EMI/RFI shield assembly of claim 1, wherein the spring member comprises a cantilever spring.

9. The shield assembly of claim 1, wherein the means for coupling includes an anchor mount projecting from the interior surface of the back wall between the adjacent openings.

10. The EMI/RFI shield assembly of claim 1, wherein the panel is an outer panel of an equipment enclosure.

11. The shield assembly of claim 1, wherein the cable assembly includes a High-Speed Serial Data Connector (HSSDC2) connector and the receptacle is a HSSDC2 receptacle.

12. An electronic apparatus comprising:
an electronic equipment panel having an electrically conductive exterior surface with adjacent apertures formed therein and electrically conductive receptacles that penetrate the apertures; and an electromagnetic interference and radio frequency interference (EMI/RFI) shield assembly coupled to the electronic equipment panel, the EMI/RFI shield assembly comprising:
a base having an EMI/RFI gasket extending along a length thereof;

spaced apart, opposing side walls, each side wall extending substantially perpendicularly from the base and having an EMI/RFI gasket extending along a length thereof;

a back wall joined between the opposing side walls and extending substantially perpendicularly from the base, the back wall having an exterior surface, an interior surface, and first and second adjacent openings formed therein, the exterior surface of the back wall making electrically conductive contact with the electrically conductive exterior surface of the panel, each back wall opening aligning with one of the apertures in the panel, and each electrically conductive receptacle penetrating one of the back wall openings; and an electrically conductive spring member coupled to the back wall and projecting inwardly between the first and second back wall openings, wherein when a cable assembly is inserted into one of the receptacles, an electrically conductive shell of the cable assembly makes electrically conductive contact with the EMI/RFI gasket extending along the base, with the EMI/RFI gasket extending along one of the side walls, and with the spring member.

13. The electronic apparatus of claim 12, wherein the spring member includes a mounting surface that is disposed between and makes electrically conductive contact with the exterior surface of the back wall and the panel of the electronic equipment.

14. The electronic apparatus of claim 12, wherein the spring member includes opposing spring walls, each spring wall making electrically conductive contact with a surface of one of the electrically conductive receptacles of the electronic equipment.

15. The electronic apparatus of claim 12, wherein the spring member is dual-pronged, and wherein, when a cable assembly is inserted into each of the receptacles, each prong of the spring member makes electrically conductive contact with an electrically conductive shell of one of the cable assemblies.

16. The electronic apparatus of claim 12, further comprising means for coupling the shield assembly to the panel, wherein the means for coupling fastens a mounting surface of the spring member to the exterior surface of the back wall.

17. The electronic apparatus of claim 12, further comprising means for coupling the shield assembly to the panel, wherein the means for coupling includes an anchor mount projecting from the interior surface of the back wall between the adjacent openings.

18. The electronic apparatus of claim 12, further comprising means for coupling the shield assembly to the panel, wherein the cable assembly includes a High-Speed Serial Data Connector (HSSDC2) connector and the receptacle is a HSSDC2 receptacle.

19. The electronic apparatus of claim 12, wherein one of the receptacles is a primary port a Fibre Channel interface and another of the receptacles is an expansion port of the Fibre Channel interface.

20. An electromagnetic interference and radio frequency interference (EMI/RFI) shield assembly comprising:
a base wall;
spaced-apart, opposing side walls, each side wall extending substantially perpendicularly from the base wall;
a back wall joined between the opposing side walls and extending substantially perpendicularly from the base wall, the back wall having first and second adjacent openings formed therein, the back wall, side walls, and base wall defining an interior region of the shield assembly;

an EMI/RFI gasket coupled to one of the walls;

an electrically conductive spring member coupled to the back wall between the first and second openings, the spring member projecting inwardly into the interior region, wherein when a cable assembly is inserted into a receptacle that projects through one of the openings, an electrically conductive shell of the cable assembly makes electrically conductive contact with the EMI/RFI gasket and with the spring member.

* * * * *